(12) United States Patent
Abadeer et al.

(10) Patent No.: US 6,188,234 B1
(45) Date of Patent: Feb. 13, 2001

(54) METHOD OF DETERMINING DIELECTRIC TIME-TO-BREAKDOWN

(75) Inventors: Wagdi W. Abadeer, Jericho; Jonathan M. McKenna, Essex Junction, both of VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/226,676

(22) Filed: Jan. 7, 1999

(51) Int. Cl.$^7$ .......................... G01R 31/26; H01L 23/58
(52) U.S. Cl. ........................ 324/766; 324/769; 257/48
(58) Field of Search .......................... 324/766, 763–769, 324/719; 257/48

(56) References Cited

U.S. PATENT DOCUMENTS

| | | | |
|---|---|---|---|
| 3,889,188 | * 6/1975 | Trindade | 324/769 |
| 4,382,229 | 5/1983 | Cottrell et al. | |
| 5,594,349 | * 1/1997 | Kimura | 324/551 |
| 5,615,377 | 3/1997 | Shimizu et al. | |
| 6,049,213 | * 4/2000 | Abadeer | 324/719 |

FOREIGN PATENT DOCUMENTS

| | | |
|---|---|---|
| 2 296 778 | 7/1996 | (GB) . |
| 8-23019 | 1/1996 | (JP) . |
| 8-46000 | 2/1996 | (JP) . |

OTHER PUBLICATIONS

D. J. DiMaria et al., "Trap Creation in Silicon Dioxide Produced by Hot Electrons," J. Appl. Phys., vol. 66, No. 6, pp. 2342–2356 (Mar. 1998).

D. J. DiMaria et al., "Ultimate Limit for Defect Generation in Ultra–Thin Silicon Dioxide," Appl. Phys. Lett, vol. 71, No. 22, pp. 3230–3232 (Dec. 1997).

H. Ning et al., "Emission Probability of Hot Electrons From Silicon Into Silicon Dioxide," J. Appl. Physics, vol. 48, No. 1, pp. 286–294 (Jan. 1977).

T.H. Ning, "Thermal Reemission of Trapped Electrons in $SiO_2$," J. Appl. Phys., vol. 49, No. 12, pp. 5996–6003 (Dec. 1978).

T.H. Ning, "Hot Electron Emission From Silicon Into Silicon Dioxide," Solid State Electronics, vol. 21, pp. 273–281 (1978).

W. K. Meyer et al., "Model For Oxide Wearout Due To Charge Trapping", IEEE/International Reliability Physics Symposium, pp. 242–247, (1983).

* cited by examiner

*Primary Examiner*—Safet Metjahic
*Assistant Examiner*—Anjan K Deb
(74) *Attorney, Agent, or Firm*—Ratner & Prestia; Tiffany L. Townsend (57) ABSTRACT

A method of determining time-to-breakdown of a gate dielectric in an NFET or a PFET transistor. For an NFET transistor, the method includes providing an N+ injector ring in the p-substrate and forward biasing the N+ injector ring with respect to the p-substrate. A first positive reference voltage level is applied to the source and the drain regions. A second positive reference voltage level is applied to the gate dielectric. The first and second positive reference voltage levels are maintained on the transistor until breakdown of the gate dielectric occurs. Another embodiment of the method may be used in a PFET transistor.

18 Claims, 10 Drawing Sheets

METHOD OF DETERMINING DIELECTRIC TIME-TO-BREAKDOWN

TECHNICAL FIELD

The present invention relates, in general, to a method of stress testing a semiconductor device and, more specifically, to a method of determining dielectric reliability of a semiconductor device by measuring its dielectric time-to-breakdown.

BACKGROUND OF THE INVENTION

Ultra-thin gate dielectric breakdown is one of the main reliability concerns in Ultra Large Scale Integration (ULSI) semiconductor products. The step of determining dielectric breakdown requires a method of using accelerated life-time stress conditions. The time required to induce the breakdown is an important factor in the overall efficiency of the method. The method of stressing a gate dielectric and determining the time-to-breakdown is a cost- and time-intensive process. It is important to find methods to reduce the stress time required in determining dielectric life-time during the development phase of the semiconductor device.

The present state-of-the-art for determining dielectric reliability is based on using high temperature and high gate voltage to accelerate the mechanism of breakdown from many years, under normal operating conditions, to hours. The gate voltage has the strongest effect in accelerating the breakdown mechanism. The higher the gate voltage, the lower is time-to-breakdown. For ultra-thin gate dielectrics, below about 5 nm, the relationship between time-to-breakdown and applied voltage is linear (on a logarithmic time, linear voltage scale) up to an upper limit of gate voltage, beyond which the relationship is non-linear.

Figure 1:
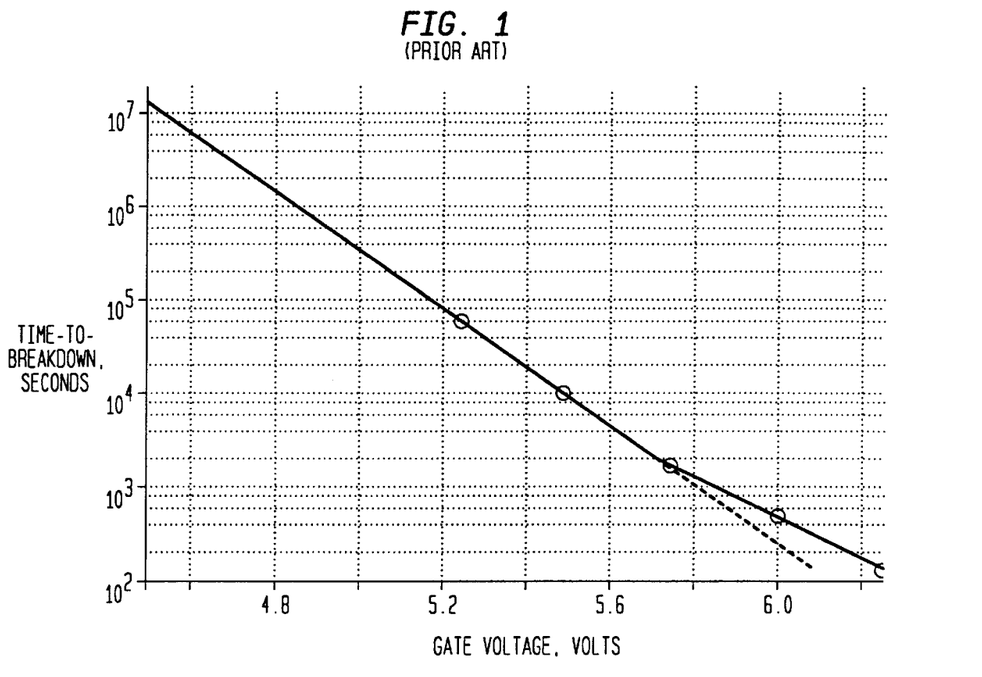
FIG. 1 is a logarithmic plot showing the gate dielectric time-to-breakdown as a function of the gate voltage of a conventional FET transistor.

This relationship is shown in FIG. 1 for a 4.5 nm oxide. To make accurate projections of the time-to-breakdown it is highly desirable to keep the accelerated stress voltage in the range where the relationship between voltage and time-to-breakdown is linear on a logarithmic scale. In FIG. 1, the time-to-breakdown deviates from a linear relationship with the gate voltage at approximately 5.8 volts. This deviation puts an upper limit on the stress voltage and, therefore, a lower limit on the time required to reach breakdown.

The problem with this conventional procedure is that the only variable available in stressing the semiconductor device is the gate voltage. The gate voltage directly determines the magnitude of gate current and the gate current (or the injected charge) has a major effect on the process of dielectric degradation leading to breakdown. A higher gate current (or injected charge) requires a lower time-to-breakdown. The problem with this stress procedure is that the gate current is not controlled independently, but rather is dictated by the applied gate voltage. Thus, the required stress time cannot be decreased below a certain time limit without compromising the accuracy of the reliability projections.

Figure 2:
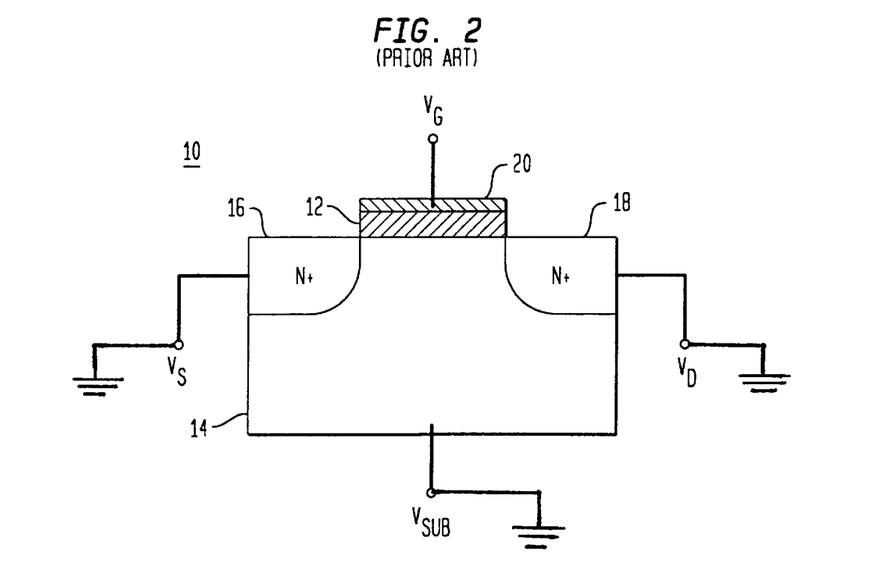
FIG. 2 shows schematically an NFET transistor biased in a conventional manner.

An example of a conventional gate dielectric stress system having a voltage applied to its gate dielectric is shown in FIG. 2. As shown, an n-type field effect transistor or NFET 10 comprises a substrate 14 having a diffused source region 16, a diffused drain region 18, and a gate oxide region or dielectric 12. Overlying the gate oxide region is a gate electrode 20. The gate electrode 20 is connected to a +Vg potential reference; the drain region 18 is connected to a Vd potential reference; the source region 16 is connected to a Vs potential reference; and the substrate 14 is connected to a Vsub potential reference. $V_S$, $V_D$ and $V_{SUB}$ are at ground potential. In this conventional system, only Vg controls the gate dielectric voltage and the amount of current injected into the gate (with the channel inverted and source and drain grounded). Because only Vg controls the gate electric field and the gate current, high values of Vg are required to reach dielectric breakdown in a reasonable time.

In a method disclosed in U.S. Pat. No. 4,382,229, issued May 3, 1983, Cottrell et al. teach that, when gate electrode 20 is biased above the threshold voltage of the NEET 10 and Vd is biased above the source voltage Vs, a channel is created between the source 16 and drain 18 and electrons flow through the channel from the source 16 to the drain 18. Electrons flowing from the source 16 to the drain 18 are "heated" by the high electric field near the drain 18, and a small fraction attain enough energy to surmount the energy barrier at the oxide-silicon interface and pass into the silicon oxide layer. The fraction of electrons which is emitted depends strongly on the electric field near the drain 18 and thus on the bias conditions and the device structure.

Cottrell et al. further teach that, by measuring the rate of change in gate current, the time required to achieve a predetermined change in source-to-drain current may be found. The problem with the Cottrell et al. method is that the emission current into the gate is small and applying the method to determine the time-to-breakdown of the dielectric is quite limited. Cottrell et al. teach a method for evaluating channel hot carriers in an FET, and do not address evaluation of dielectric breakdown in an FET.

In another disclosure, U.S. Pat. No. 5,615,377 issued Mar. 25, 1997 to Shimizu et al., a method of simulating hot carrier deterioration of a p-type metal-oxide semiconductor (PMOS) FET is taught. Shimitzu et al. provide a method by which a PMOS FET is forward and reverse biased. By measuring the characteristics of the PMOS FET and applying them in a simulation, Shimizu et al. estimate the deterioration of the transistor. Their teachings are limited: the method applies only to a PMOS FET and does not teach how to measure the time-to-breakdown of a PMOS FET or an NMOS FET.

In yet another disclosure, U.K. Patent Application No. 2,296,778 A, published on Oct. 7, 1996, there is disclosed a method for testing the reliability of a dielectric film on a semiconductor substrate. The method applies a gate current which is increased in successive steps until the dielectric film breaks down. A disadvantage of this method is that, in order to increase the gate current, the gate voltage must also be increased. Gate current cannot be independently controlled from gate voltage.

The method also does not work in ultra-thin dielectrics, because a very high stress field must be applied until breakdown occurs. Applying a high electric field to the gate results in inaccuracies in determining the dielectric reliability. At high electric fields the relationship between applied gate voltage and the time-to-breakdown is non-linear on a logarithmic scale, thereby causing errors in extrapolating the results to determine the time- to-breakdown.

Another method is taught by H. Ning et al. in Journal of Applied Physics, Volume 48, page 286 (1977). A negative, or reverse bias is applied to Vsub and a positive, or forward bias, is applied to Vg with Vs and Vd both at a ground potential (refer to FIG. 2). A tungsten light bulb (not shown) supplies photons into the gate lectrode 20 and gate dielectric 12, which in turn generates electron-hole pairs in substrate 14. The electrons gain energy from the electric field, as they drift toward the interface between the substrate 14 (silicon) and the gate dieletric 12 (silicon dioxide) . The electrons arriving at the interface with sufficient energy are emitted into the gate dielectric 12. These emitted electrons are collected as the gate current. The method taught by H. Ning et al. requires two reference voltages, Vg and Vsub, as well as a light energy source. Vg and Vsub cannot supply enough electrons into the gate, however, because Vg and Vsub are kept at low reference potentials. Furthermore, this method is not feasible for integrated processing applications where the semiconductor is covered by back-end-of-line (BEOL) dielectrics and metals.

The deficiencies of the conventional methods show that a need still exists for a method to measure the dielectric time-to-breakdown of an FET transistor that does not require a high gate voltage. To overcome the shortcomings of the conventional methods, a new method is provided of determining dielectric reliability of a semiconductor device by measuring its dielectric time-to-breakdown. An object of the present invention is to provide a method which allows independent control of the gate current from the gate voltage, so that the gate current may be increased without having to also increase the gate voltage. Another object is to provide a method which can accurately predict reliability without wasting a great amount of time to reach dielectric breakdown.

SUMMARY OF THE INVENTION

To achieve these and other objects, and in view of its purposes, the present invention is directed to a method of determining time-to-breakdown of a gate dielectric in an NFET transistor. The NFET transistor has a p-substrate, an N+ source region, and an N+ drain region. The method includes providing an N+ injector ring in the p-substrate and forward biasing the N+ injector ring with respect to the p-substrate. A first positive reference voltage level is applied to the source and the drain regions, and a second positive reference voltage level is applied to the gate dielectric. The first and second positive reference voltage levels are maintained on the transistor until breakdown of the gate dielectric occurs.

In another embodiment, the method of the present invention determines time-to-breakdown of a gate dielectric in a PFET transistor. The PFET transistor has an N-well region, a P+ source region, and an P+ drain region. The method includes providing a P+ injector ring in the N-well region and forward biasing the P+ injector ring with respect to the N-well. A first negative reference voltage level is applied to the source and drain regions, and a second negative reference voltage level is applied to the gate dielectric. The first and second negative reference voltage levels are maintained on the transistor until breakdown of the gate dielectric occurs.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Figure 3:
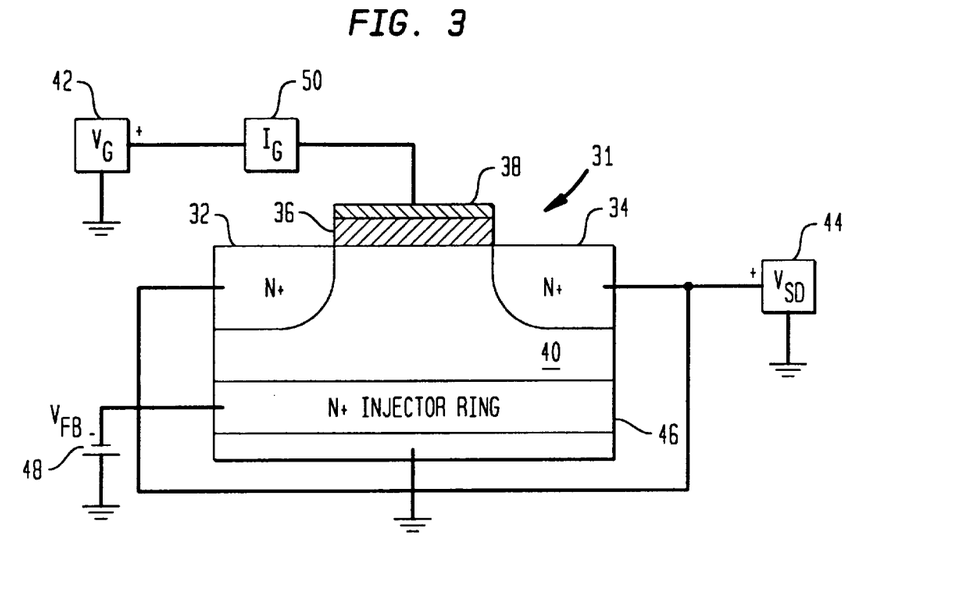
FIG. 3 shows schematically a test system for accelerated life-time stressing of an NFET transistor in accordance with an embodiment of the present invention.

Ultra-thin gate dielectric breakdown is one of the main reliability concerns in ultra large scale integration (ULSI) semiconductor devices. Determining the dielectric breakdown requires a method of using accelerated life-time stressing on these devices. FIG. 3 illustrates schematically a test system 30 for accelerated life-time stressing of an NFET transistor 31. As will be explained, test system 30 independently controls both the gate dielectric voltage and the gate current. With independent controls, the injected charge into the gate dielectric may be increased to high values, while the gate voltage, or the gate dielectric electric field, may be maintained at any value, independent of the gate current.

Referring to FIG. 3, NFET transistor 31 comprises a p-substrate 40 having a diffused N+ source region 32 and a diffused N+ drain region 34. A gate oxide or dielectric layer 36 overlies the region of p-substrate 40 between source region 32 and drain region 34. Overlying the gate oxide or dielectric layer 36 is a gate electrode 38. An N+ diffusion ring in the p-substrate 40 is formed surrounding the active region of the NFET transistor 31. The N+ diffusion ring is shown schematically in FIG. 3 as the N+ injector ring 46. The N+ injector ring 46 is formed in a conventional manner by diffusing N+ dopant into the p-substrate 40 in the region surrounding the source region 32, drain region 34, and gate dielectric 36 of NFET transistor 31. In this manner, a P-N junction is formed in p-substrate 40 between the p-substrate itself and the N+ injector ring 46.

The p-substrate 40 is connected to a ground reference potential, as shown, while the N+ injector ring 46 is connected to Vfb supply 48 having a negative reference potential with respect to ground. Vfb supply 48 is fixed at a negative voltage greater than 0.8 volts in magnitude, thereby creating a forward biased (FB) junction between the N+ injector ring 46 and the p-substrate 40.

The diffused N+ source region 32 and diffused N+ drain region 34 are connected to a variable Vsd supply 44, having a positive reference potential with respect to ground, as shown. By applying a positive bias voltage to the source and drain regions, a depletion layer is created with a positive gradient of voltage potential which increases toward the silicon (Si) surface of p-substrate 40. With this positive gradient, the minority carriers (electrons in the p-substrate) created by the FB junction are swept and accelerated toward the gate oxide or dielectric layer 36 (SiO$_2$).

With a diffusion voltage from Vsd supply 44 greater than the electron Si/SiO$_2$ barrier height (which is approximately 3 V), the electrons have enough potential energy to overcome the barrier height and are injected into the gate oxide or dielectric layer 36. Thus, a flow of gate current, Ig, measured by ammeter 50, is created which may be increased to high values by increasing one or more of the following parameters: (a) more negative voltage to the N+ injector ring 46 supplied from Vfb supply 48, (b) more positive voltage to the source region 32 and drain region 34 supplied from Vsd supply 44, or (c) greater ambient temperature at the NFET transistor 31 under test.

Still referring to FIG. 3, the gate electrode 38 is connected in series with ammeter 50 and variable Vg supply 42. Vg supply 42 biases gate electrode 38 with a positive reference potential with respect to ground. During testing of NFET transistor 31, the gate voltage is kept at a positive reference potential with respect to the source and drain reference potential. Stated differently, Vg is greater than Vsd. In this manner, the Si surface of NFET transistor 31 is inverted and a positive electric field is available to which the injected electrons may be attracted. Furthermore, the actual voltage applied to the gate dielectric (Vox) is the difference between the voltage applied to the gate electrode (Vg) and the voltage applied to the source and drain regions (Vsd). Also, to overcome the Si/SiO$_2$ barrier height, Vsd has a minimum value of approximately 3.0 V. Stated differently, $$\text{Vox} = \text{Vg} - \text{Vsd}, \quad (1)$$

$$\text{Vg} < \text{Vsd} > 3.0 \text{ Volts} \quad (2).$$

The control of the gate dielectric voltage (Vox) is thus provided by the gate voltage (Vg); the source and drain diffusion voltage (Vsd) is used to control the amount of injected charge through the Si/SiO$_2$ barrier. This arrangement provides independent control of the gate current (Ig) and the gate dielectric voltage (Vox).

Figure 4:
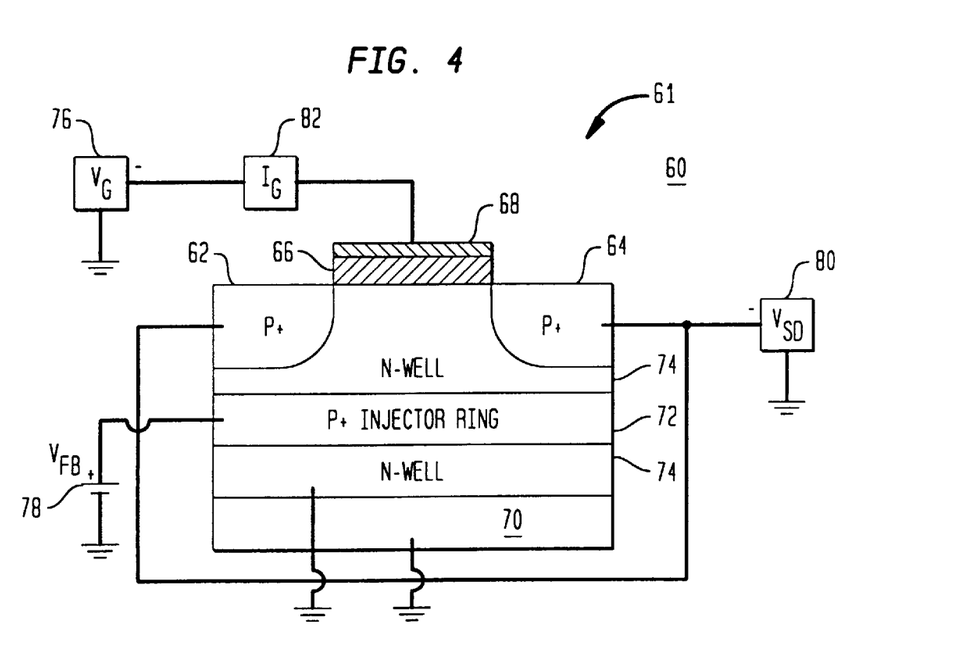
FIG. 4 shows schematically a test system for accelerated life-time stressing of a PFET transistor in accordance with another embodiment of the present invention.

FIG. 4 illustrates schematically a test system 60 for a PFET transistor 61. PFET transistor 61 comprises a p-substrate 70 having a diffused P+ source region 62 and diffused P+ drain region 64. A gate oxide layer 66 overlies the region of p-substrate 70, which forms part of an N-weil region 74, between the source region 62 and drain region 64. Overlying the gate oxide layer 66 is a gate electrode 68. An N-well region 74 is formed in a conventional manner in p-substrate 70. A P+ diffusion ring in the n-well region 74 is formed surrounding the active region of the PFET transistor 61. The P+ diffusion ring is shown schematically in FIG. 4 as the P+ injector ring 72. The P+ injector ring 72 is formed in a conventional manner by diffusing P+ dopant into the N-well region 74. The P+ injector ring 72 surrounds the source region 62, drain region 64, and gate dielectric 66 of PFET transistor 61. A P-N junction is formed in N-well region 74 between the N-well region itself and the P+ injector ring 72.

The p-substrate 70 and the N-well region 74 are connected to a ground reference potential, as shown, while the P+ injector ring 72 is connected to Vfb supply 78 having a positive reference potential with respect to ground. Vfb supply 78 is fixed at a positive voltage, creating a FB junction between the P+ injector ring 72 and the N-well region 74.

The diffused P+ source region 62 and diffused P+ drain region 64 are connected to a variable Vsd supply 80. As shown, the variable Vsd supply 80 has a negative reference potential with respect to ground. With this negative potential, the minority carriers (holes in the N-well region 74), created by the FB junction, are swept and accelerated toward the gate oxide layer 66 (dielectric). The gate electrode 68 is connected in series with an ammeter 82 and a variable Vg supply 76. With a diffusion voltage from Vsd supply 80 greater than the hole Si/SiO$_2$ barrier height, which is approximately 4.3 V, the holes have enough potential energy to overcome the barrier height and are injected into the gate oxide layer 66. Thus, a flow of gate current, Ig, measured by ammeter 82, is created which may be increased to high values by increasing one or more of the following parameters: (a) more positive voltage to the P+ injector ring 72 supplied from Vfb supply 78, (b) more negative voltage to the source region 62 and drain region 64 supplied from Vsd supply 80, or (c) greater ambient temperature at the PFET transistor 61 under test.

Figure 5A:
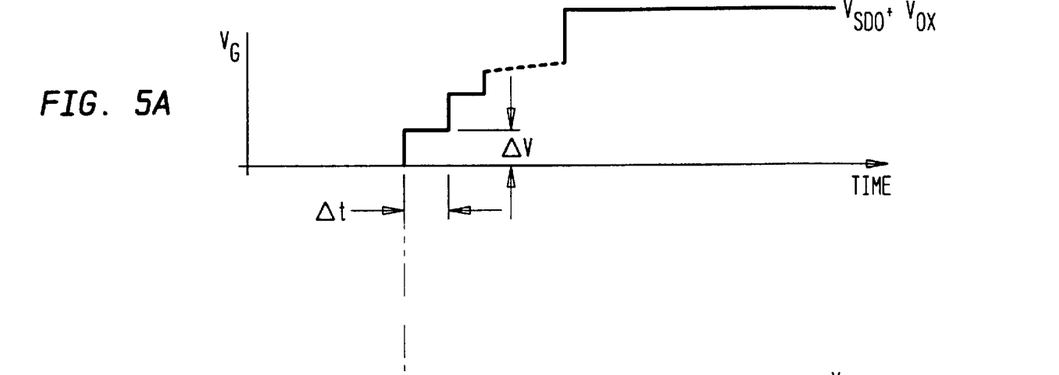
FIGS. 5a and 5b show successive step increases in supply voltages as a function of time in accordance with one embodiment of the present invention.
Figure 5B:
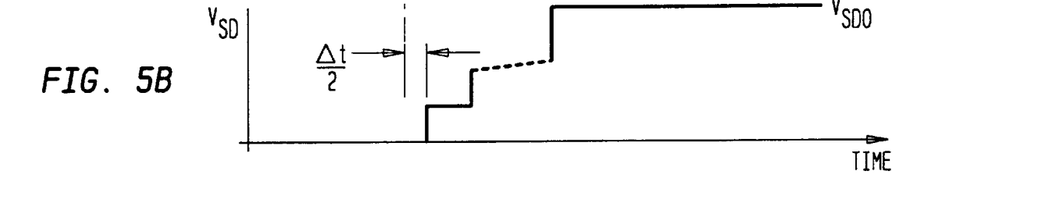

During the test, care needs to be taken in applying voltages, particularly for the PFET transistor 61, because of the high voltage applied to the gate electrode 68. The voltages may be applied in incremental steps to prevent excessive voltages from being accidentally applied to any region of the transistor. Thus, the Vsd supply may be successively incremented; after each step, the Vg supply is in-turn incremented in magnitude. This procedure is shown in FIGS. 5a and 5b. As shown, the Vg supply voltage and the Vsd supply voltage are increased in incremental steps. Vsd is increased to reach the desired value, Vsdo; Vg is increased to reach the desired value of Vsdo+Vox, where Vox is the desired voltage across the gate dielectric.

Figure 6A:
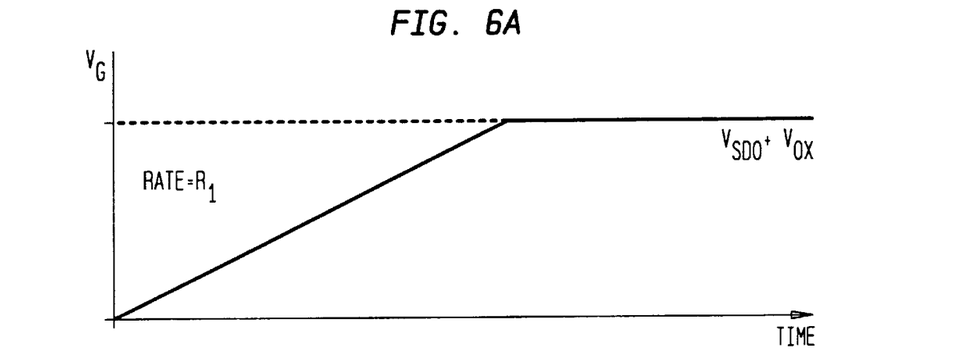
FIGS. 6a and 6b show linear ramp increases in supply voltages as a function of time in accordance with another embodiment of the present invention.
Figure 6B:
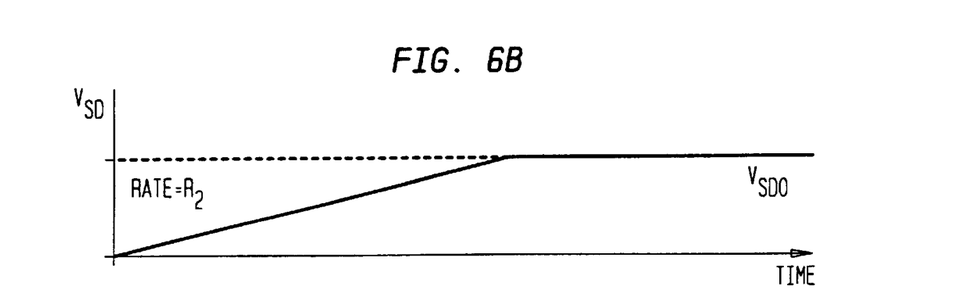

FIGS. 6a and 6b show the voltages being increased linearly, by ramping the Vg and the Vsd supply voltages until the desired voltage values are reached. In both sets of graphs, FIGS. 5a–5b and FIGS. 6a–6b, the voltage increases are such that, at any time, Vg–Vsd is not large enough to cause accidental damage to the gate dielectric. For the increment al voltage ramp shown in FIGS. 5a–5b, Vg and Vsd increase in steps of ΔV, applied for a period of Δt. For example, ΔV may be 0.5 V, and it may be 1 Second (the equivalent ramp rate is 0.5 V/Second). Similarly, the voltage ramp for Vsd, shown in FIGS. 6a–6b, is made to start later than the voltage ramp for Vg by a period equal to Δt/2. Thus, the difference Vg–Vsd does not exceed 0.5 V at any time during the ramping process. For the system in FIGS. 6a–6b, Vg has a ramp rate of R1, for example 0.5 V/Second, and Vsd has a ramp rate of R2, less than R1. R2 is such that the voltage difference Vg–Vsd is kept to a desired value during the ramping process.

In summary, the present invention comprises the following method steps:

(a) forward biasing an injector ring surrounding the active region of an FET transistor (an N+ injector ring surrounding the source, drain, and gate dielectric of an NFET transistor; a P+ injector ring surrounding the source, drain, gate, and N-well of a PFET transistor), (b) controlling the gate dielectric voltage (Vox) by varying the Vg supply and the Vsd supply so that $$|vox| = |vg| - |Vsd| \quad (3)$$

and $$|Vg| > |Vsd| \quad (4)$$

where Vg and Vsd are both positive with respect to ground for an NFET transistor, and Vg and Vsd are both negative with respect to ground for a PFET transistor ($|Vsd| \geq 3.0$ V for an NFET; $|Vsd| \geq 4.3$ V for a PFET), (c) maintaining the gate dielectric voltage (Vox) on the FET transistor until breakdown of the dielectric occurs, as observed by a step increase in the measured gate current (Ig), (d) recording the time-to-breakdown at the Vox value, and (e) repeating the above steps for another value of Vox.

Figure 7:
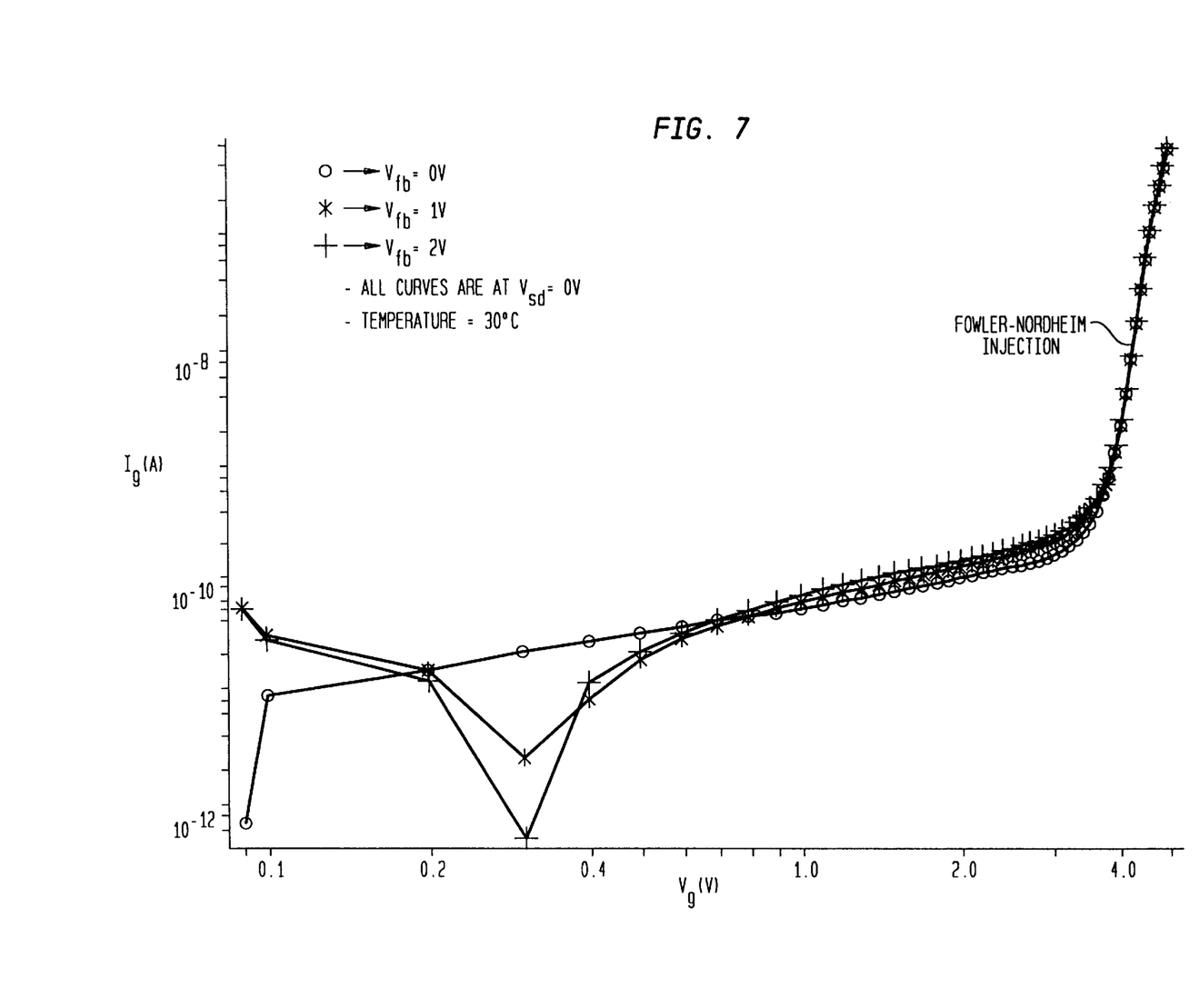
FIG. 7 is a logarithmic plot showing gate current (Ig) as a function of Vg supply voltage for three different values of Vfb, while Vsd is kept at 0 V.

FIG. 7 shows the effect of Vfb on the gate current Ig for Vsd equal to zero. As shown, the electrons generated by Vfb are not attracted to the gate, because they do not have sufficient energy to surmount the Si/SiO$_2$ barrier. As such, Vfb has little effect on Ig. This relationship is evident in FIG. 7 from the significant conduction through the gate oxide in the Fowler-Nordheim region, without significant change in Ig, as Vfb is varied from 0 to 2 V.

Figure 8A:
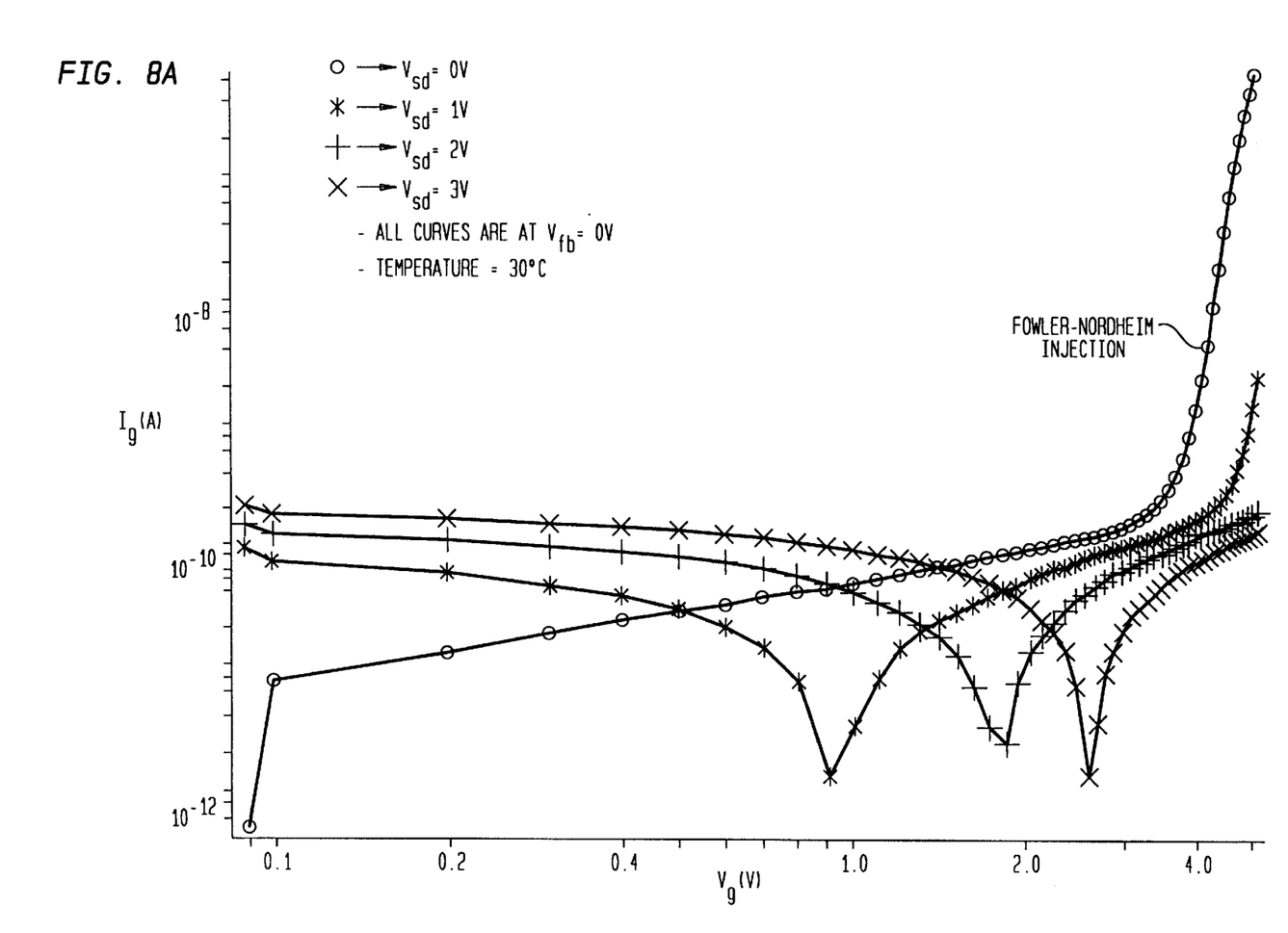
FIGS. 8a, 8b, and 8c are logarithmic plots similar to FIG. 7 for various values of Vfb and Vsd.
Figure 8B:
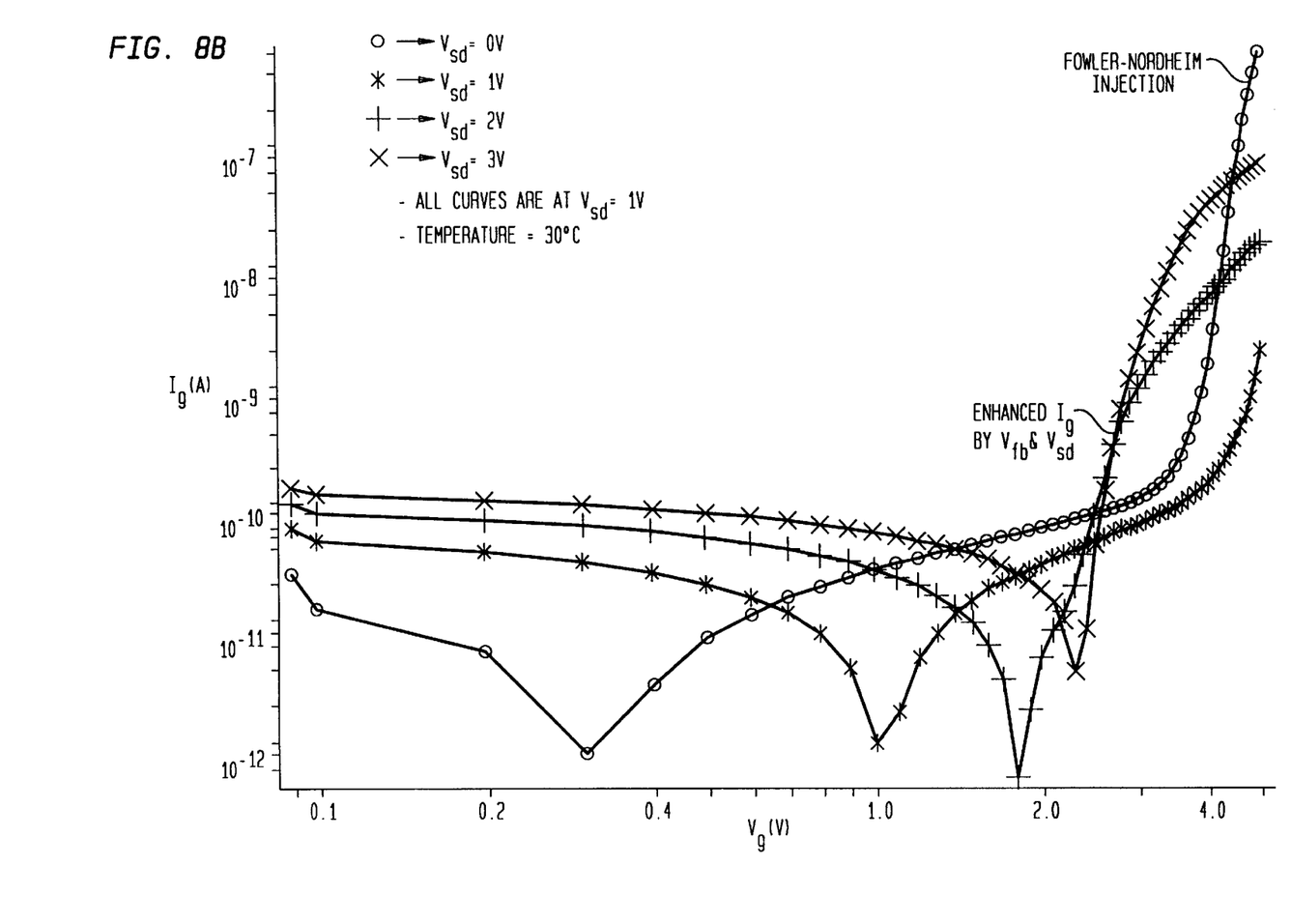
Figure 8C:
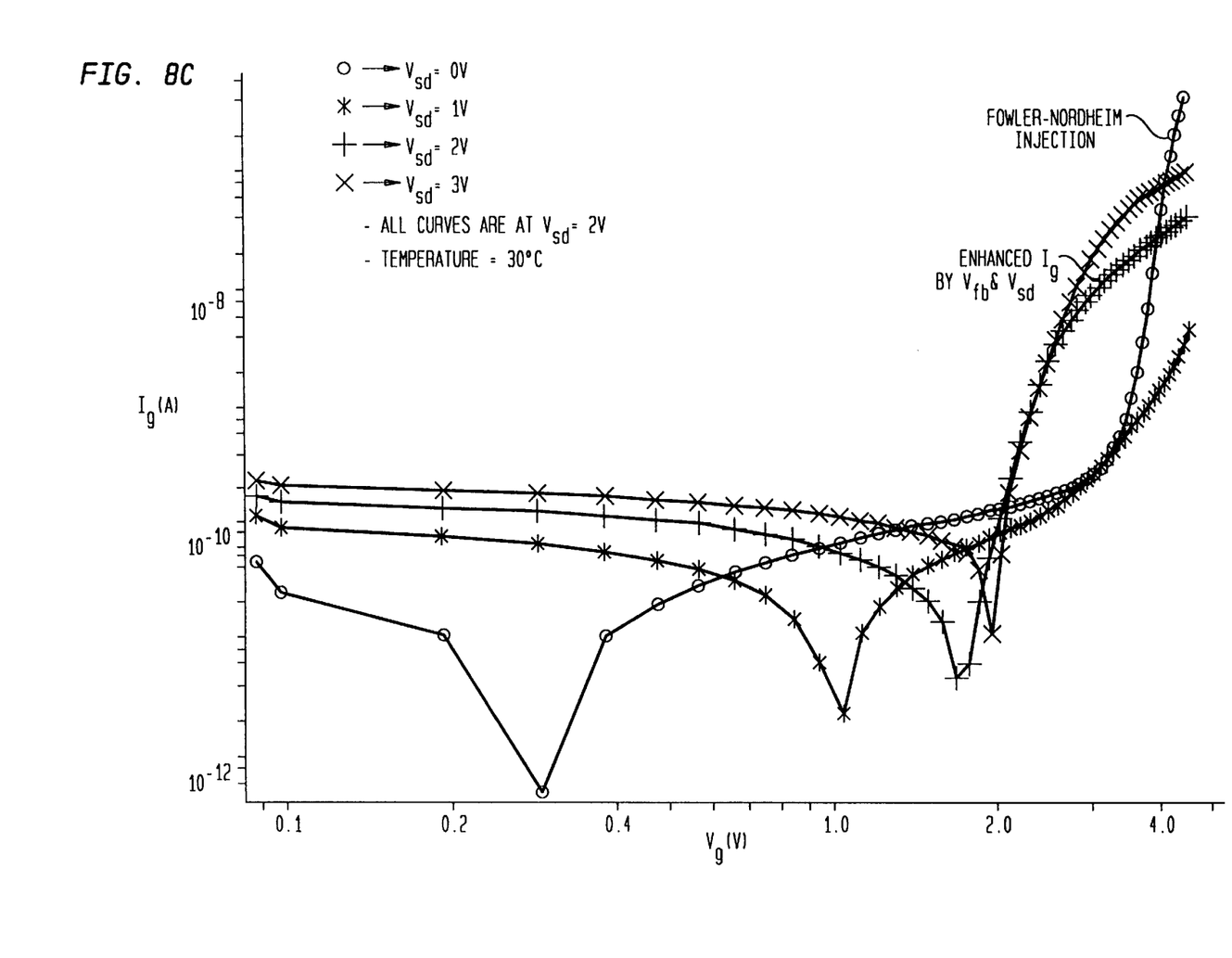

FIGS. 8a, 8b, and 8c illustrate the effect on conduction through the gate oxide when Vfb is similarly changed from 0 to 2 V, but Vsd is also changed from 0 to 3 V. When Vfb is zero (FIG. 8a), no electrons are generated by Vfb and conduction is controlled by the oxide voltage (Vg–Vsd). The Fowler-Nordheim conduction curves are shifted to the right, i.e., there is a higher Vg with a corresponding higher Vsd. FIGS. 8b and 8c show the effect of Vsd on Ig for the cases of Vfb equal to 1 V and 2 V, respectively. Here, the increase in Ig before the onset of the Fowler-Nordheim tunneling (particularly at Vsd equal to 3 V) may be seen clearly. With Vsd equal to or greater than 3 V (Si—SiO$_2$ barrier), the electrons attracted toward the channel can overcome the Si—SiO$_2$ barrier and are injected into the gate, thus contributing to Ig. When Vsd is 2 V, some of the carriers are still able to surmount the Si—SiO$_2$ barrier, because of the nature of the carrier energy distribution. The effect of Vfb becomes significant when Vfb reaches 1 V (the P-N junction electrostatic potential) with no further appreciable increase in Ig with higher values of Vfb. Saturation of current in the FB junction has been reached.

Figure 9:
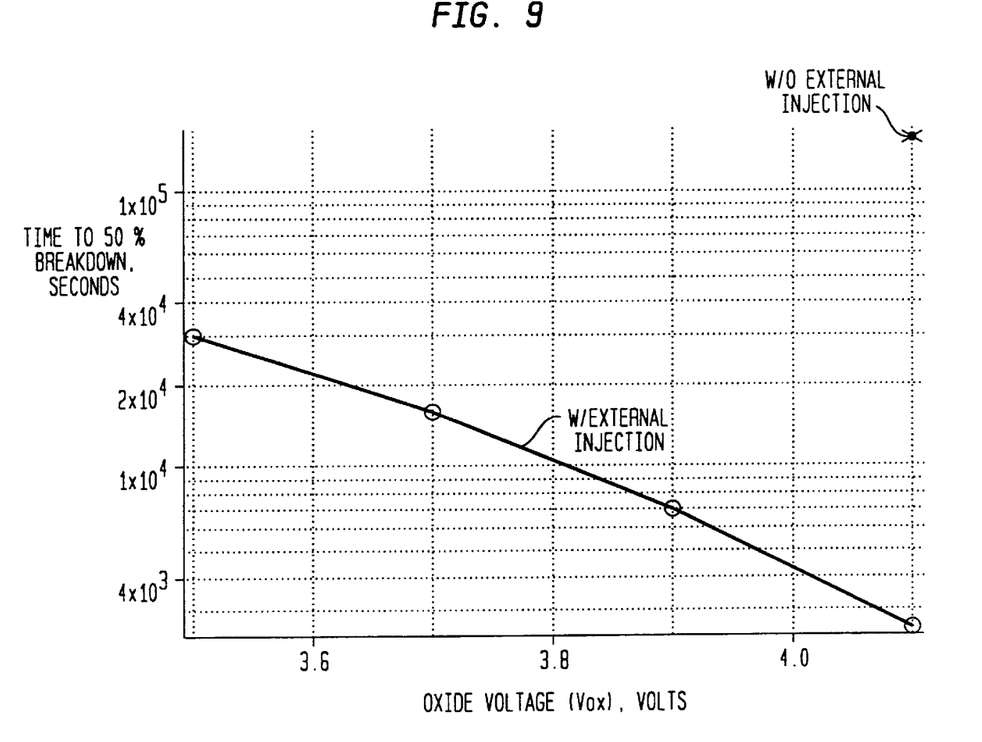
FIG. 9 is a plot of time-to-breakdown (50 percentile) as a function of oxide voltage (Vox)
Figure 10:
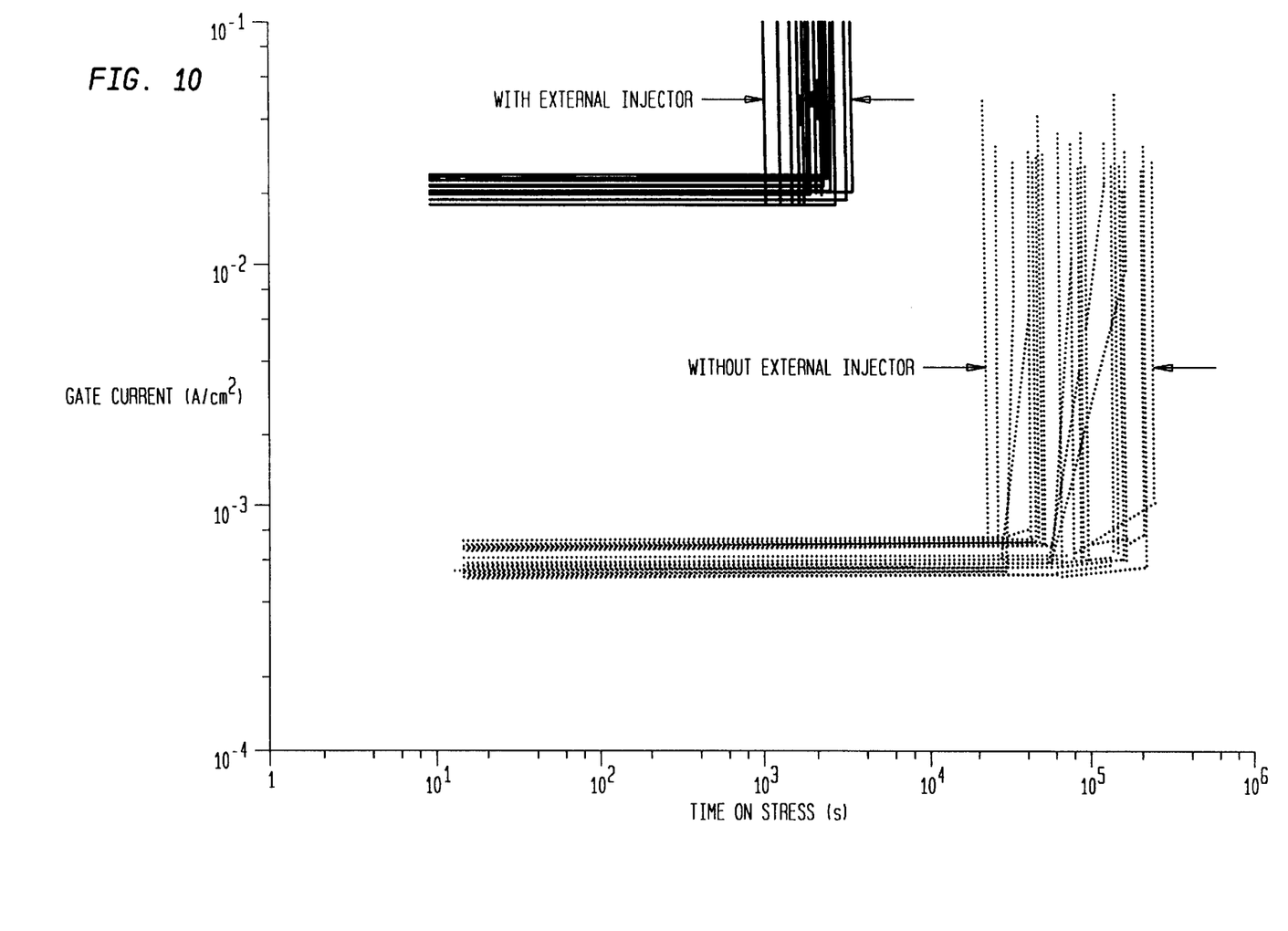
FIG. 10 is a plot of gate current as a function of stress-time.

FIG. 9 demonstrates the effectiveness of using external injection for stress testing an NFET transistor with a gate oxide thickness of 3.9 nm. FIG. 9 plots the 50 percentile time-to-breakdown in seconds as a function of the gate oxide voltage (Vox) for the following values: 3.5 V, 3.7 V, 3.9 V, and 4.1 V. Also shown is the time-to-breakdown without external injection for Vox of 4.1 V. For the same value of Vox (4.1 V), the time to reach 50 percent failures without external injection is approximately $2 \times 10^5$ seconds, while only approximately $2.5 \times 10^3$ seconds are required to reach breakdown with external injection. FIG. 10 similarly demonstrates the effectiveness of using external injection, by showing the difference in gate current (Ig) and time-to-breakdown for both external injection and constant voltage stress without external injection.

Figure 11:
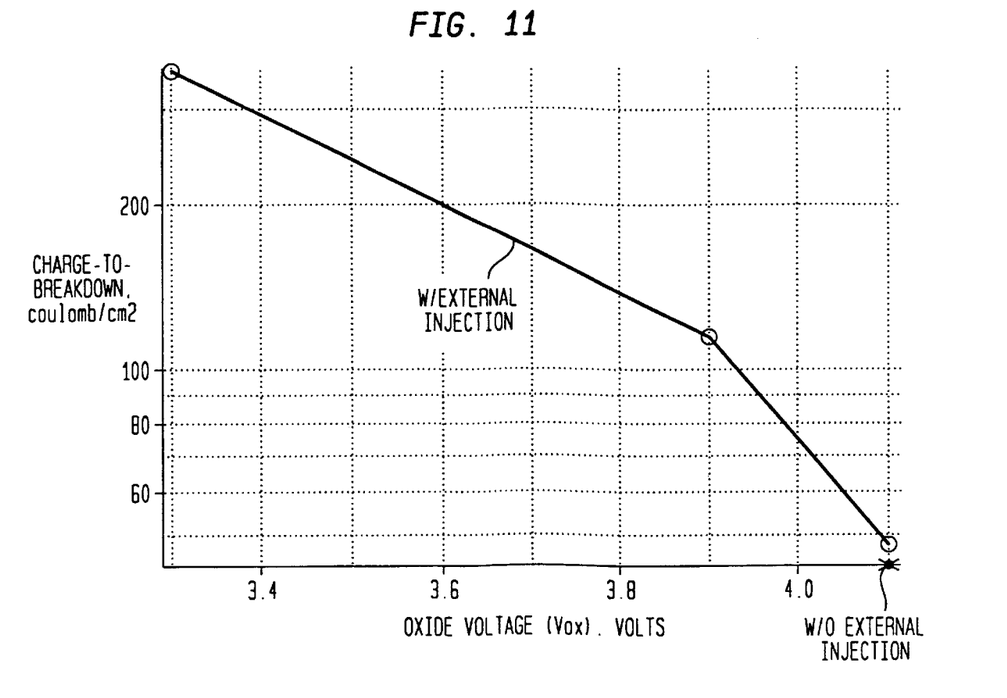
FIG. 11 is a plot of charge-to-breakdown as a function of Vox.

FIG. 11 demonstrates that the method of the present invention of determining time-to-breakdown results in the same reliability projection as does the conventional method. As shown, the 50 percentile value of charge-to breakdown (Qbd) for both methods is the same at Vox of 4.1 V. Also shown are other gate dielectric voltages, each having a different oxide breakdown level as obtained by the method of the present invention. The time-to-breakdown is given by Qbd divided by the gate current:

Time-to-breakdown=Qbd/Ig and Qbd is the fundamental parameter for the physical breakdown model, as established by D. J. DiMaria et al. in Applied Physics Letters, Volume 71, at pages 3230–3232 (1997).

Figure 12:
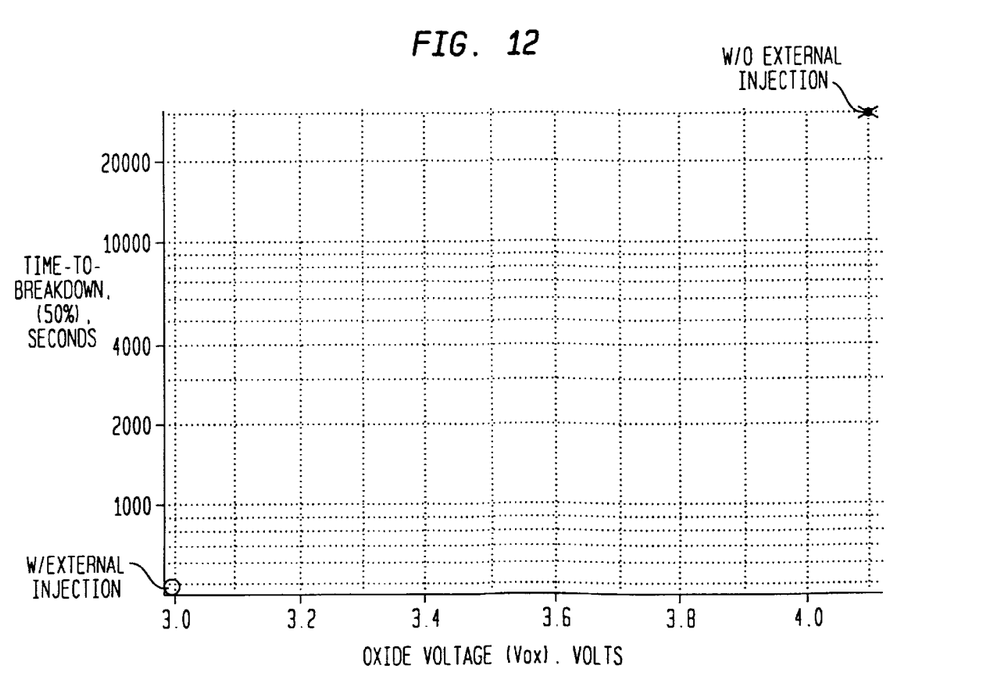
FIG. 12 is a plot of time-to-breakdown (50 percentile) as a function of Vox.

FIG. 12 is another illustration of the dramatic reduction in time-to-reach dielectric breakdown, when the stressing is done with external injection on a PFET transistor. In the conventional case, without external injection, approximately 30,000 seconds are required to reach the 50 percentile time-to-breakdown (oxide voltage of 4.1 V). Using the method of the present invention, however, approximately 200 seconds are required to reach the 50 percentile time-to-breakdown with a lower oxide voltage of 3.0 V.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method of determining time-to-breakdown of a gate dielectric in an NFET transistor, the method comprising the steps of:

(a) providing an N+ injector ring in a p-substrate of the transistor, (b) forward biasing the N+ injector ring with respect to the p-substrate, (c) applying a first positive reference voltage level to a source region and a drain region of the transistor, (d) applying a second positive reference voltage level to the gate dielectric, the second positive reference voltage level higher than the first positive reference voltage level, and (e) maintaining the first and second positive reference voltage levels until breakdown of the gate dielectric occurs.

2. The method of claim 1 wherein step (b) includes applying a negative reference voltage level to the N+ injector ring and applying a ground reference level to the p-substrate.

3. The method of claim 2 wherein the negative reference voltage level is at least 0.8 volts.

4. The method of claim 1 wherein the N+ injector ring surrounds the source region, the drain region, and the gate dielectric.

5. The method of claim 1 wherein the first positive reference voltage level is approximately 3.0 volts.

6. The method of claim 1 wherein steps (c) and (d) include increasing the first and second positive reference voltage levels until a desired voltage difference between the first positive reference voltage level and the second positive reference voltage level is reached, the voltage difference determining a gate dielectric voltage level.

7. The method of claim 6 wherein increasing the reference voltage levels follows one of a linearly increasing ramp function and a piece-wise incremental step function.

8. The method of claim 7 wherein breakdown of the gate dielectric is determined by a step increase in the amount of current flowing through the gate dielectric.

9. The method of claim 8 wherein breakdown is observed by a discontinuous change in the amount of current flowing through the gate dielectric.

10. A method of determining time-to-breakdown of a gate dielectric in a PFET transistor, the method comprising the steps of:

(a) providing an P+ injector ring in an N-well region of the transistor, (b) forward biasing the P+ injector ring with respect to an N-well of the transistor, (c) applying a first negative reference voltage level to a source region and a drain region of the transistor, (d) applying a second negative reference voltage level to the gate dielectric, the second negative reference voltage level having a higher absolute magnitude than the first negative reference voltage level, and (e) maintaining the first and second negative reference voltage levels until breakdown of the gate dielectric occurs.

11. The method of claim 10 wherein step (b) includes applying a positive reference voltage level to the P+ injector ring and applying a ground reference level to the N-well.

12. The method of claim 11 wherein the positive reference voltage level is at least 0.8 volts.

13. The method of claim 10 wherein the P+ injector ring surrounds the source region, the drain region, and the gate dielectric.

14. The method of claim 10 wherein the first negative reference voltage level is approximately 4.3 volts.

15. The method of claim 10 wherein steps (c) and (d) include increasing the first and second negative reference voltage levels until a desired voltage difference between the first negative reference voltage level and the second negative reference voltage level is reached, the voltage difference determining a gate dielectric voltage level.

16. The method of claim 15 wherein increasing the reference voltage levels follows one of a linearly increasing ramp function and a piece-wise incremental step function.

17. The method of claim 16 wherein breakdown of the gate dielectric is determined by a step increase in the amount of current flowing through the gate dielectric.

18. The method of claim 17 wherein breakdown is observed by a discontinuous change in the amount of current flowing through the gate dielectric.

* * * * *

UNITED STATES PATENT AND TRADEMARK OFFICE
CERTIFICATE OF CORRECTION

PATENT NO.    : 6,188,234 B1
DATED         : February 13, 2001
INVENTOR(S)   : Wagdi W. Abadeer et al.

It is certified that error appears in the above-identified patent and that said Letters Patent is hereby corrected as shown below:

<u>Column 2,</u>
Line 8, delete "NEET" and insert -- NFET --;

<u>Column 5,</u>
Formula 1 line 34, delete "Vg<Vsd>3.0 Volts " and insert -- $Vg > Vsd \geq 3.0$ Volts --.

Signed and Sealed this

Eleventh Day of February, 2003

JAMES E. ROGAN
*Director of the United States Patent and Trademark Office*